United States Patent
Oomori et al.

(10) Patent No.: US 10,872,780 B2
(45) Date of Patent: Dec. 22, 2020

(54) DRY ETCHING AGENT COMPOSITION AND DRY ETCHING METHOD

(71) Applicant: Central Glass Company, Limited, Ube (JP)

(72) Inventors: Hiroyuki Oomori, Ube (JP); Akifumi Yao, Ube (JP); Isamu Mori, Ube (JP)

(73) Assignee: Central Glass Company, Limited, Ube (JP)

( * ) Notice: Subject to any disclaimer, the term of this patent is extended or adjusted under 35 U.S.C. 154(b) by 0 days.

(21) Appl. No.: 16/341,695

(22) PCT Filed: Oct. 23, 2017

(86) PCT No.: PCT/JP2017/038100
§ 371 (c)(1),
(2) Date: Apr. 12, 2019

(87) PCT Pub. No.: WO2018/096855
PCT Pub. Date: May 31, 2018

(65) Prior Publication Data
US 2019/0287812 A1    Sep. 19, 2019

(30) Foreign Application Priority Data
Nov. 28, 2016  (JP) ................. 2016-229880

(51) Int. Cl.
*H01L 21/311*  (2006.01)
*C09K 13/00*  (2006.01)
*H01L 21/3065*  (2006.01)

(52) U.S. Cl.
CPC ........ *H01L 21/31116* (2013.01); *C09K 13/00* (2013.01); *H01L 21/3065* (2013.01); *C09K 2205/126* (2013.01); *C09K 2205/128* (2013.01)

(58) Field of Classification Search
None
See application file for complete search history.

(56) References Cited

U.S. PATENT DOCUMENTS

2011/0079040 A1   4/2011   Morimoto et al.
2011/0312101 A1   12/2011  Tsuchiya et al.
(Continued)

FOREIGN PATENT DOCUMENTS

JP    2010-83818 A    4/2010
JP    2012-114402 A   6/2012
(Continued)

OTHER PUBLICATIONS

International Search Report (PCT/ISA/210) issued in PCT Application No. PCT/JP2017/038100 dated Jan. 9, 2018 with English translation (four (4) pages).
(Continued)

*Primary Examiner* — Jiong-Ping Lu
(74) *Attorney, Agent, or Firm* — Crowell & Moring LLP

(57) ABSTRACT

Disclosed is the invention of a dry etching agent composition including: 1,3,3,3-tetrafluoropropene; and a hydrochlorofluorocarbon represented by $CH_xCl_yF_z$ (wherein x, y and z are integers of 1 or greater and x+y+z=4), wherein a concentration of the hydrochlorofluorocarbon relative to 1,3,3,3-tetrafluoropropene is 3 volume ppm or greater to less than 10000 volume ppm, and a use of this dry etching agent composition. An object of the present invention is to suppress corrosion of storage container, pipes and an etching chamber by suppressing generation of acidic substances by improving storage stability of HFO-1234ze without losing excellent etching characteristics of HFO-1234ze.

9 Claims, 2 Drawing Sheets

(56) References Cited

U.S. PATENT DOCUMENTS

| | | | |
|---|---|---|---|
| 2012/0065435 A1* | 3/2012 | Nishiguchi | C07C 17/206 570/164 |
| 2012/0203037 A1* | 8/2012 | Sharratt | C07C 17/389 570/179 |
| 2013/0105728 A1 | 5/2013 | Umezaki et al. | |
| 2013/0158305 A1 | 6/2013 | Takahashi | |
| 2015/0051426 A1 | 2/2015 | Fukushima et al. | |

FOREIGN PATENT DOCUMENTS

| | | |
|---|---|---|
| JP | 4952834 B2 | 6/2012 |
| JP | 2015-178514 A | 10/2015 |
| WO | WO 2009/157325 A1 | 12/2009 |
| WO | WO 2010/098447 A1 | 9/2010 |
| WO | WO 2010/098451 A1 | 9/2010 |
| WO | WO 2013/161724 A1 | 10/2013 |
| WO | WO 2016/181723 A1 | 11/2016 |

OTHER PUBLICATIONS

Japanese-language Written Opinion (PCT/ISA/237) issued in PCT Application No. PCT/JP2017/038100 dated Jan. 9, 2018 (four(4) pages).

* cited by examiner

DRY ETCHING AGENT COMPOSITION AND DRY ETCHING METHOD

TECHNICAL FIELD

The present invention relates to a method for plasma-etching silicon-based material, a dry etching agent composition to be used for it, and to a storage container in which the dry etching agent composition is filled.

BACKGROUND OF THE INVENTION

In recent years, in semiconductor processing, fining is under study, and there is tendency that as a working line becomes thin, an aspect ratio that is a ratio of the working line to the depth of a trench or hole increases dramatically. With the development of a semiconductor processing technique, an etching agent to be used in an etching process has been developed.

In this etching process, an etching device using plasma is widely used, and as a treatment gas, it is required to highly selectively etch only a $SiO_2$ or SiN film with respect to a photoresist (hereinafter, referred to as PR) film and an amorphous carbon (hereinafter, referred to as a-C) film with a selective ratio of, for example, 3.0 or greater and at a high rate such as an etching rate of 50 nm/min. or greater.

Heretofore, as such an etching gas, for example, fluorine-containing saturated hydrocarbons and fluorine-containing unsaturated hydrocarbons, such as $CF_4$ gas, c-$C_4F_8$ gas and $C_4F_6$ gas have been known. However, in the conventional gases, selective ratio is not sufficient and linearity of an etching shape during processing cannot be kept, and it gradually becomes difficult for dealing with a fining technique in recent years.

In addition, since these fluorine-containing saturated hydrocarbons each are a substance having a long life in the atmosphere, and each have a high global warming potential (GWP), they are specified as emission control substances in the Kyoto protocol (COP3).

The semiconductor industry thus has a demand for alternative low-GWP substances of high cost efficiency and capable of fine processing. As a gas satisfying these, for example, in a patent document 1, as a method for selectively etching $SiO_2$ or SiN, a method using 1,3,3,3-tetrafluoropropene (HFO-1234ze), an additive gas and an inert gas has been disclosed.

On the other hand, since the life of hydrofluoroolefins in the atmosphere, such as HFO-1234ze, is long, its stability is also considered. A gas such as a hydrofluoroolefin is generally stored in a container, such as a storage tank and a filling cylinder for transportation. As a material of the storage container, carbon steel, manganese steel, chromium-molybdenum steel and other low alloy steel, stainless steel, aluminum alloys or the like is used. Although the stability of high purity HFO-1234ze is sufficient if it is under the condition that HFO-1234ze does not come in contact with the atmosphere, in case where the atmosphere, especially, oxygen is mixed therein, there is case where decomposition of HFO-1234ze proceeds and then acidic substances are generated, depending on a storage state. Therefore, to actually use it, it is necessary to take measures to suppress the generation of the acidic substances by suppressing the progress of the decomposition. However, details of decomposition behavior are not known for sure a lot, and most of them depend on experimental technique.

In particular, when HFO-1234ze is used as etching gas, there is a problem that the acidic substances generated by the decomposition during storage corrode metal materials of the storage container, pipes and an etching chamber, and metal components are mixed into a treatment gas, and then a semiconductor water that is an object to be treated is contaminated by the metal components. Therefore, high storage stability is demanded of the etching gas.

As a method for suppressing the decomposition of a hydrofluoroolefin used as a refrigerant composition for a refrigerator and the like, for example, in a patent document 2, a method has been disclosed in which alcohols, such as methanol and ethanol, are added to HFO-1234ze and the like. In addition, in a patent document 3, a method has been disclosed in which phthalic acid mono-alkali metal salt is added to the same kind of tetrafluoropropene.

On the other hand, a method has also been disclosed in which by regulating the concentration of oxygen becoming the original cause of the decomposition, the stability in the storage container is improved. For example, in a patent document 4, a method has been disclosed in which by adding oxygen such that the concentration of oxygen in the gas phase in the storage container is in the range from 3 volume ppm to 3000 volume ppm deliberately, the decomposition of the tetrafluoropropene is suppressed. In addition, in a patent document 5, a method for suppressing the deterioration of a refrigerant by a method in which in case where tetrafluoropropene is used as a refrigerant in a refrigerator, an air suction means for removing the air, especially, oxygen mixed in the refrigerator is provided has been described.

In consideration of the corrosion of the storage container and the pipes, it can be considered that the removing of moisture contained in HFO-1234ze is also an effective means. As to the moisture contained in HFO-1234ze, as described in a patent document 6, a method for removing the moisture by bringing HFO-1234ze into contact with zeolite has been known. In addition, as described in a patent document 7, it has been known that the content of the moisture can be largely lowered by a method in which HFO-1234ze is brought into contact with an aqueous solution containing lithium chloride.

PRIOR ART REFERENCES

Patent Documents

Patent Document 1: Japanese Patent Application Publication 2012-114402
Patent Document 2: International Publication 2010/098447
Patent Document 3: International Publication 2010/098451
Patent Document 4: International Publication 2013/161724
Patent Document 5: International Publication 2009/157325
Patent Document 6: Japanese Patent Application Publication 2010-83818
Patent Document 7: Japanese Patent 4952834

SUMMARY OF THE INVENTION

In the patent document 1, although an etching method using an additive gas and an inert gas has been disclosed, the purity of HFO-1234ze is not described.

The use of an refrigerant composition, in which alcohols had been added, as etching gas, which is described in the patent document 2, is not preferable, because there are concerns that alcohols largely affect etching performance. In addition, it is a well-known fact that the contamination of metal onto a wafer affects semiconductor characteristics, and the gas in which metal salt had been added, which is described in the patent document 3, is not preferable as etching gas.

On the other hand, in the method described in the patent document 4, in which the concentration of oxygen in the gas phase in the storage container is regulated in the range from 3 volume ppm or greater to less than 3000 volume ppm, when tetrafluoropropene is used as etching gas, if oxygen and HFO-1234ze coexist in a cylinder, oxygen with a lower boiling point is largely contained at the initial flowing stage, and its composition is changed between the initial flowing stage and the final flowing stage. In particular, in an etching process, oxygen is a component to be generally used as acidification gas, and if the concentration of oxygen is changed with time, the decomposition behavior of HFO-1234ze in plasma is not stable, and it is therefore not preferable in a semiconductor manufacturing process.

In addition, when it is used as etching gas, since the gas does not circulate in a process, even if the air suction means described in the patent document 5 is provided, it does not lead to the reduction of the oxygen concentration in the cylinder.

As mentioned above, there is a method for reducing the moisture contained in a system to suppress the actions of acid generated by the decomposition of HFO-1234ze. However, in the manufacturing of HFO-1234ze, a washing process of HFO-1234ze by water is general, and even if a drying process is carried out, a certain quantity of moisture is often contained in HFO-12343ze. Although it is possible to suppress a moisture value extremely low with cost, it is industrially not realistic.

Due to such a background, a method for suppressing corrosion of a storage container, pipes and an etching chamber by suppressing the generation of acidic substances by improving the storage stability of FHO-1234ze without losing excellent etching characteristics of HFO-1234ze, in a semiconductor manufacturing process, has been required.

Therefore, as a result of an eager study to achieve the object by the inventors, it has been found that, when used as etching gas, if a certain quantity of a hydrochlorofluorocarbon, such as R22 ($CHClF_2$), is contained in HFO-1234ze, the stability of HFO-1234ze in which a minute quantity of each of moisture and oxygen had been mixed in a storage container is improved, and the generation of acidic substances during the storage can be suppressed, and thereby the corrosion of the storage container and pipes can be suppressed.

In addition, in the etching using the mixed gas, it has also found that it has sufficient selectivity between PR and $SiO_2$, and thus, the present invention was completed.

That is, the present invention provides a dry etching agent composition including: 1,3,3,3-tetrafluoropropene; and a hydrochlorofluorocarbon represented by $CH_xCl_yF_z$ (wherein x, y and z are integers of 1 or greater and x+y+z=4), wherein a concentration of the hydrochlorofluorocarbon relative to 1,3,3,3-tetrafluoropropene is 3 volume ppm or greater to less than 10000 volume ppm, and provides a storage container filled with and sealed therein the dry etching agent composition In addition, the present invention provides a dry etching method, including the steps of: converting a dry etching agent to plasma, the dry etching agent in which 1,3,3,3-tetrafluoropropene and a hydrochlorofluorocarbon represented by $CH_xCl_yF_z$ (wherein x, y and z are integers of 1 or greater and x+y+z=4) are contained, and a concentration of the hydrochlorofluorocarbon relative to 1,3,3,3-tetrafluoropropene is 3 volume ppm or greater to less than 10000 volume ppm; and etching silicon oxide or silicon nitride by using plasma gas converted into plasma.

Effects of the Invention

According to the present invention, by suppressing the generation of acidic substances caused by the decomposition of HFO-1234ze during storage, the corrosion of a storage container, pipes and an etching chamber can be suppressed, and, in addition to this, it is possible to obtain a dry etching agent composition with excellent etching characteristics, which contains HFO-1234ze.

DETAILED DESCRIPTION

Figure 1:
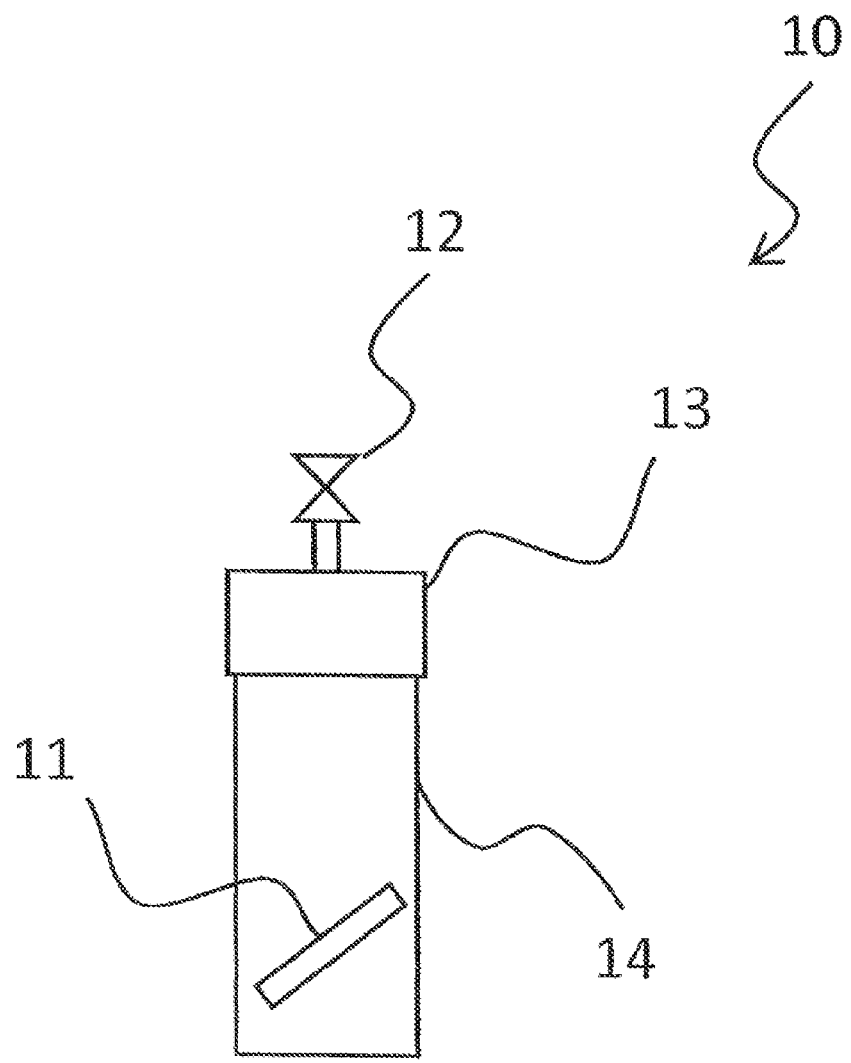
FIG. 1 is a schematic diagram of a storage test container 10 used in Examples and Comparative Examples.

In the following, an embodiment of the present invention will be described below. In addition, the scope of the present invention is not limited to the description, and the present invention can be preferably modified without departing from the scope and spirit of the present invention other than the following examples, and then can be carried out.

A dry etching method according to the present invention is a dry etching method including the steps of; converting the dry etching agent to plasma; and etching silicon oxide or silicon nitride by using plasma gas converted into plasma. A dry etching agent composition of the present invention is characterized by including: 1,3,3,3-tetrafluoropropene; and a hydrochlorofluorocarbon represented by $CH_xCl_yF_z$ (wherein x, y and z are integers of 1 or greater and x+y+z=4), wherein a concentration of the hydrochlorofluorocarbon relative to 1,3,3,3-tetrafluoropropene is 3 volume ppm or greater to less than 10000 volume ppm. In addition, hereinafter, values of volume ppm and volume % are values under one atmospheric pressure at 25° C.

1,3,3,3-tetrafluoropropene to be used in the present invention is also referred to as HFO-1234ze, and either of cis and trans isomers or Z and E isomers can be used, and it can be manufactured by a conventionally well-known method. For example, by the present inventors, in Japanese Patent No. 3465865, a method for obtaining HFO-1234ze by acting HF on 1-chloro-3,3,3-trifluoropropene, which can be obtained on an industrial scale, in the presence of a gas phase fluorination catalyst has been disclosed. In addition, in Japanese Patent No. 3821514, a method for obtaining HFO-1234ze by acting HF on 1,1,3,3,3-pentachloropropane has been disclosed.

A hydrochlorofluorocarbon represented by $CH_xCL_yF_z$ (wherein x, y and z are integers of 1 or more, and x+y+z=4) which is used in the present invention is one of chlorodifluoromethane, dichlorofluoromethane and chlorofluoromethane. Among them, it is preferable to use chlorodifluoromethane. Chlorodifluoromethane is also referred to as R22 or HCFC-22, and its chemical formula is $CHClF_2$. When the content of the hydrochlorofluorocarbon was 3 volume ppm or greater relative to HFO-1234ze, a sufficient effect of suppressing generation of acid caused by decomposition of HFO-1234ze was recognized. In particular, the content of the hydrochlorofluorocarbon relative to HFO-1234ze may be 50 volume ppm or greater, or may be 100 volume ppm or greater. In addition, in a test using a molecule having a structure similar to that of R22, such as $CF_4$ and $CH_4$, the same effect was not recognized.

Here, unlike metal salt, the hydrochlorofluorocarbon does not cause contamination of metal to a wafer.

On the other hand, when paying attention to an influence on etching characteristics, in the patent document 1, it has been described that a side wall protection is affected by a double bond included in HFO-1234ze. On the other hand, the hydrochlorofluorocarbon does not include a double bond inside its molecule, and it can be considered that an influence on the side wall protection is poor. Therefore, the content of the hydrochlorofluorocarbon relative to HFO-1234ze is preferably less than 10000 volume ppm, in consideration of the influence on the etching characteristics. In addition, the content of R22 relative to HFO-1234ze is preferably less than 1000 volume ppm, in consideration of the influence on the etching characteristics.

As a storage container for HFO-1234ze, if it is an airtight container which is capable of sealing gas-liquid mixture thereinside, one can be used which does not need a special structure and constituent material, and which has wide ranges of modes and functions. For example, general manganese steel and stainless steel cylinders that are storage containers for high-pressure gas can be used. In a manufacturing process, a purification process and a fulling process, there is case where, relative to HFO-1234ze, 10 volume ppm or greater to 10000 volume ppm or less of oxygen and 1 volume ppm or greater to 10000 volume ppm or less of water are mixed in the storage container. In particular, when 100 volume ppm or greater of oxygen is contained and 5 volume ppm or greater of water is contained, the present invention can be preferably applied thereto, and when 500 volume ppm or greater of oxygen is contained and the 10 volume ppm or greater of water is contained, the present invention can be further preferably applied thereto.

In the present invention, it is preferable that HFO-1234ze and the hydrochlorofluorocarbon to be used are each highly purified to be a purity of at least 99.9 volume % or greater.

Next, an etching method using a dry etching agent in the present invention will be described.

The etching method of the present invention can be carried out under various dry etching conditions. A mixed gas of HFO-1234ze and the hydrochlorofluorocarbon only can be used for the etching agent. However, in general, from the point of view of cost effectiveness and the stability of plasma, various additive gasses and inert gasses can be added so as to be a desired etching rate, etching selection ratio and etching shape.

As an additive gas, at least one gas selected from the group consisting of $O_2$, $O_3$, CO, $CO_2$, $COCl_2$, $COF_2$, $CF_2(OF)_2$, $CF_3OF$, $NO_2$, NO, $F_2$, $NF_3$, $Cl_2$, $Br_2$, $I_2$ and $XF_n$ (In the formula, X represents Cl, Br, or I, n is an integer, and $1 \leq n \leq 7$) can be used. In addition, to obtain a desired etching shape and etching rate, etching can be performed by adding one or more kinds of reducing gasses, fluorocarbons, hydrofluorocarbons and halogen-containing compounds (for example, at least one gas selected from the group consisting of $H_2$, HF, HI, HBr, HCl, $NH_3$, $CF_4$, $CF_3H$, $CF_2H_2$, $CFH_3$, $C_2F_6$, $C_2F_4H_2$, $C_2F_5H$, $C_3F_8$, $C_3F_7H$, $C_3F_6H_2$, $C_3F_5H_3$, $C_3F_4H_4$, $C_3F_3H_5$, $C_3F_5H$, $C_3F_3H$, $C_3ClF_3H$, $C_4F_8$, $C_4F_8$, $C_5F_8$ and $C_5F_{10}$). As an inert gas, at least one gas selected from the group consisting of $N_2$, He, Ar, Ne, Kr and Xe can be used.

A preferable composition ratio of an etching agent containing the mixed gas of HFO-1234ze and the hydrochlorofluorocarbon or the mixed gas of HFO-1234ze and R22 and further containing the additive gas and/or the inert gas is shown below. In addition, the total of the volume % of each gas is 100 volume %.

The concentration of the mixed gas of HFO-1234ze and the hydrochlorofluorocarbon relative to the total of the mixed gas, the additive gas and the inert gas is preferably 1-50 volume %, more preferably 5-40 volume %, further preferably 10-30 volume %.

In addition, the concentration of the additive gas relative to the total of the mixed gas, the additive gas and the inert gas is preferably 0-50 volume %, more preferably 0-10 volume %.

Moreover, the concentration of the inert gas relative to the total of the mixed gas, the additive gas and the inert gas is preferably 0-98 volume %, more preferably 5-95 volume %, further preferably 60-90 volume %.

The etching method to be used in the present invention can be carried out without being limited to various etching methods, such as capacitive coupling type plasma (CCP) etching, reactive ion etching (RIE), induction coupling type plasma (ICP) etching, electronic cyclotron resonance (ECR) plasma etching and microwave etching.

As components contained in the etching gas, they can be independently introduced into a chamber, or can be introduced into the chamber, after being prepared as a mixed gas in advance behind the storage container. The total flow rate of the dry etching agent to be introduced into the reaction chamber can be properly selected, in consideration of the above-mentioned concentration condition and pressure condition, depending on the volume of the reaction chamber and the exhaust capacity of an exhaust portion.

To obtain stable plasma and to suppress side etching by improving linearity of ions, the pressure at the time when the etching is performed is preferably 5 Pa or less, especially preferably 1 Pa or less. On the other hand, if the pressure inside the chamber is too low, ionized ions decrease, and sufficient plasma density cannot be obtained. Therefore it is preferably 0.05 Pa or greater.

In addition, a substrate temperature at the time of the performing of the etching is preferably 100° C. or less, and in particular, to perform anisotropic etching, it is preferably 50° C. or less, especially preferably 20° C. or less. If the temperature exceeds a high temperature of 100° C., the formation of a protection film onto mask material, such as PR and a-C, is not sufficiently performed, and selectivity deteriorates. In addition, at a high temperature, the formation of a side wall protection film is not sufficiently performed, and there is possibility that shape abnormality called a so-called bowing in which the etching shape becomes a rounded shape occurs.

As to a bias voltage between electrodes, which is generated at the time of the performing of the etching, it is simply selected in consideration of a desired etching shape. For example, when anisotropic etching is performed, it is desirable that a voltage between the electrodes of approximately 500V-10000V is generated to make ions high energy states. If the bias voltage is too high, the energy of the ions increases, and it may cause the deterioration of the selectivity.

In consideration of the efficiency of an element manufacturing process, an etching time is preferably 30 minutes or less. Here, the etching time is a period of time during reacting the dry etching agent with a sample by generating plasma inside the chamber.

EXAMPLES

In the following, although Examples of the present invention are cited with Comparative Examples, the present invention is not limited to the following Examples.

Example 1

(Storage Stability Test)

To evaluate corrosion of a container caused by generation of acid, a stability test using a test piece was carried out. FIG. 1 is a schematic diagram of a storage test container 10 used in Examples and Comparative Examples. A pressure-resistant container 14 made of SUS316 of which internal volume was 100 cc and in which a test peace 11 (2.0 mm×10 mm×30 mm) made of iron was sealed was made. The pressure-resistant container 14 is sealed by a lid 13, and the lid 13 includes a valve 12 which is capable of introducing gas to the pressure-resistant container 14. Forty grams of a mixed gas prepared by adding R22 to HFO-1234ze (E) which had been purified to be a high purity of 99.9 volume % or greater in advance, such that the content of R22 is 3 volume ppm, was sealed into the pressure-resistant container 14. Then, oxygen in an amount of 4000 volume ppm in gas phase components was added thereto, in consideration of mixture of air. In addition, the content of moisture contained inside the container was 10 volume ppm. This container was kept at 100° C. for 60 days.

Thirty days later, the test piece was taken out, and its mass change was measured and the state of its surface was visually observed. As a result of this, the mass change of the test piece was less than 0.01%, and a change in appearance of the test piece was also not observed.

(Etching Test)

Figure 2:
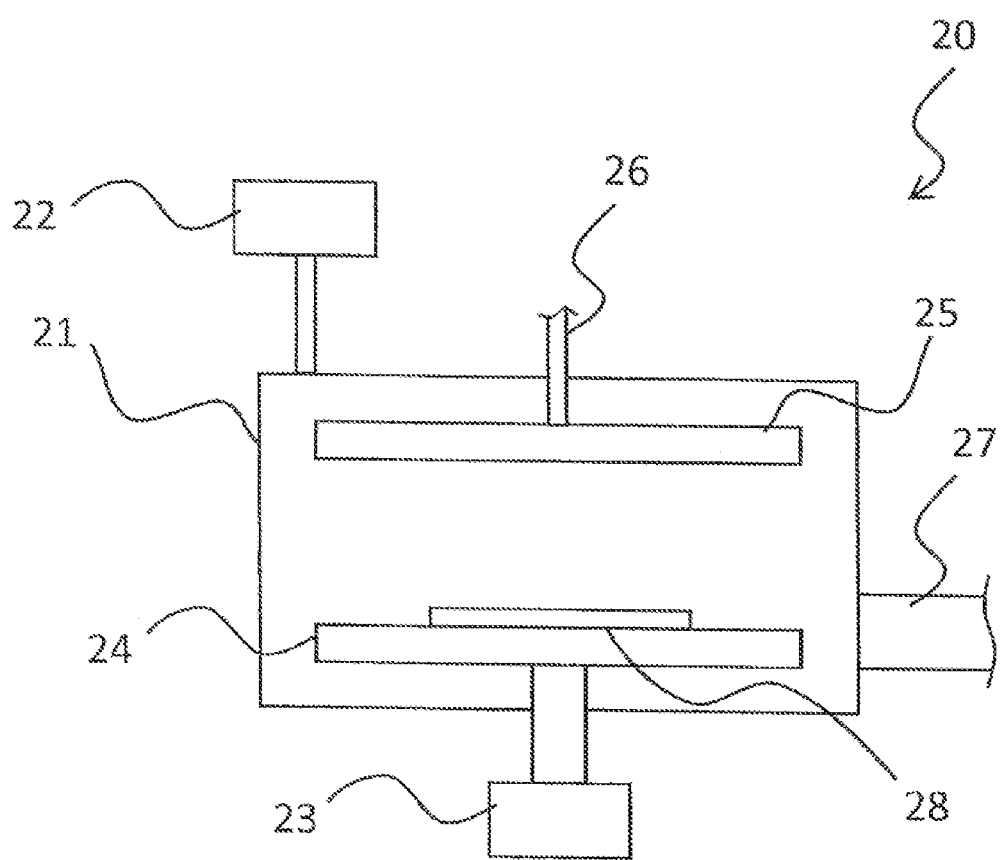
FIG. 2 is a schematic diagram of a reactor 20 used in Examples and Comparative Examples.

To investigate an influence on etching characteristics by R22, an etching test was carried out, using the mixture of HFO-1234ze (E) and R22 before the addition of oxygen. FIG. 2 is a schematic diagram of a reactor 20 used in Examples and Comparative Examples. A lower electrode 24 that functions to support a wafer and also functions as a stage, an upper electrode 25 and a pressure gauge 22 are disposed inside a chamber 21. In addition, a gas introduction port 26 is connected to the upper part of the chamber 21. The pressure inside the chamber 21 is adjustable, and it is possible to excite the dry etching agent by a high frequency power source (13.56 MHz) 23. With this, the etching of a sample 28 can be carried out by bringing the excited dry etching agent into contact with the sample 28 placed on the lower electrode 24. The reactor 20 is configured such that, in a state in which the dry etching agent is introduced, when a high frequency power is supplied from the high frequency power source 23, a DC voltage called as bias voltage is generated between the upper electrode 25 and the lower electrode 24 by the moving speed difference between ions and electrons in the plasma. The gas inside the chamber 21 is discharged via a gas discharge line 27.

As the sample 28, a silicon wafer A having a $SiO_2$ film and a silicon wafer B having a PR film were placed on the stage which was cooled to 15° C. The $SiO_2$ film was formed by a CVD method. In addition, the PR film was formed by applying.

Then, the etching was performed in a manner in which the flow rate of the mixture of 1,3,3,3-tetrafluoropropene (HFO-1234ze (E)) and R22, the flow rate of the $O_2$ and the flow rage of Ar were respectively set to 25 sccm, 25 sccm, and 500 sccm, and the gas of the sufficiently mixed these gases was circulated in the chamber, and the high frequency power was supplied at 400 W to convert the etching agent into plasma.

After the etching, an etching rate was obtained by changes in the thickness of the $SiO_2$ film of the silicon wafer A and the thickness of the PR film of the silicon wafer B, before and after the etching. Moreover, as each etching selection ratio, a value calculated by dividing the etching rate of $SiO_2$ by the etching rate of PR was obtained.

As a result of this, in Example 1, the etching rate of $SiO_2$ was 77.7 nm/min., and the etching rate of PR was 15.1 nm/min. Therefore the selection ratio of PR to $SiO_2$ ($SiO_2$/PR) was 5.15.

Example 2

A storage test sample was prepared under the same condition as that of Example 1, except that HFO-1234ze (E), in which the content of R22 was 235 volume ppm, which was obtained by adding R22 to HFO-1234ze was used. In addition, the content of moisture contained in HFO-1234ze (E) filled in the pressure-resistant container was 12 volume ppm. As a result of this, a mass change of the test piece before and after the test was less than 0.01%, and a change in appearance of the test piece was also not observed. In addition, in the same manner as in Example 1, an etching test was carried out, using the mixture of R22 and HFO-1234ze (E) before addition of oxygen. As a result of this, the etching rate of $SiO_2$ was 79.2 nm/min., and the etching rate of PR was 15.8 nm/min. Therefore the selection ratio of PR to $SiO_2$ ($SiO_2$/PR) was 5.01.

Example 3

A storage test sample was prepared under the same condition as that of Example 1, except that HFO-1234ze (E), in which the content of R22 was 986 volume ppm, which was obtained by adding R22 to HFO-1234ze (E) was used. In addition, the content of moisture contained in HFO-1234ze (E) filled in the pressure-resistant container was 15 volume ppm. As a result of this, a mass change of the test piece before and after the test was less than 0.01%, and a change in appearance of the test piece was also not observed. In addition, in the same manner as in Example 1, an etching test was carried out, using the mixture of R22 and HFO-1234ze (E) before addition of oxygen. As a result of this, the etching rate of $SiO_2$ was 78.5 nm/min., and the etching rate of PR was 15.6 nm/min. Therefore the selection ratio of PR to $SiO_2$ ($SiO_2$/PR) was 5.03.

Example 4

A storage test sample was prepared under the same condition as that of Example 1, except that HFO-1234ze (E), in which the content of R22 was 3098 volume ppm, which was obtained by adding R22 to HFO-1234ze (E) was used. In addition, the content of moisture contained in HFO-1234ze (E) filled in the pressure-resistant container was 11 volume ppm. As a result of this, a mass change of the test piece before and after the test was less than 0.01%, and a change in appearance of the test piece was also not observed. In addition, in the same manner as in Example 1, an etching test was carried out, using the mixture of R22 and HFO-1234ze (E) before addition of oxygen. As a result of this, the etching rate of $SiO_2$ was 76.1 nm/min., and the etching rate of PR was 17.2 nm/min. Therefore the selection ratio of PR to $SiO_2$ ($SiO_2$/PR) was 4.42.

Example 5

A storage test sample was prepared under the same condition as that of Example 1, except that HFO-1234ze (E), in which the content of R22 was 8029 volume ppm, which was obtained by adding R22 to HFO-1234ze (E) was used. In addition, the content of moisture contained in HFO-1234ze (E) filled in the pressure-resistant container was 13 volume ppm. As a result of this, a mass change of the test piece before and after the test was less than 0.01%, and a change in appearance of the test piece was also not observed. In addition, in the same manner as in Example 1, an etching test was carried out, using the mixture of R22 and HFO-1234ze (E) before addition of oxygen. As a result of this, the etching rate of $SiO_2$ was 76.8 nm/min., and the etching rate of PR was 17.4 nm/min. Therefore the selection ratio of PR to $SiO_2$ ($SiO_2$/PR) was 4.41.

Example 6

A storage test sample was prepared under the same condition as that of Example 1, except that HFO-1234ze (E), in which the content of R22 was 3 volume ppm, was used and oxygen in an amount of 500 volume ppm in gas phase components was added. In addition, the content of moisture contained in HFO-1234ze (E) filled in the pressure-resistant container was 14 volume ppm. As a result of this, a mass change of the test piece before and after the test was less than 0.01%, and a change in appearance of the test piece was also not observed.

Comparative Example 1

A storage test sample was prepared under the same condition as that of Example 1, except that HFO-1234ze (E) in which the content of R22 was less than 1 volume ppm was used. In addition, the content of moisture contained in HFO-1234ze (E) filled in the pressure-resistant container was 22 volume ppm. As a result of this, a mass change of the test piece before and after the test was 0.03%, and coloring that seems like rust was observed on the surface thereof. Moreover, in the same manner as in Example 1, an etching test was carried out, using HFO-1234ze (E) before addition of oxygen. As a result of this, the etching rate of $SiO_2$ was 77.3 nm/min., and the etching rate of PR was 14.9 nm/min. Therefore the selection ratio of PR to $SiO_2$ ($SiO_2$/PR) was 5.19.

Comparative Example 2

A storage test sample was prepared under the same condition as that of Example 1, except that HFO-1234ze (E), in which the content of R22 was 12521 volume ppm, which was obtained by adding R22 to HFO-1234ze (E) was used. In addition, the content of moisture contained in HFO-1234ze (E) filled in the pressure-resistant container was 19 volume ppm. As a result of this, a mass change of the test piece before and after the test was less than 0.01%, and a change in appearance of the test piece was also not observed. In addition, in the same manner as in Example 1, an etching test was carried out, using the mixture of R22 and HFO-1234ze (E) before addition of oxygen. As a result of this, the etching rate of $SiO_2$ was 68.9 nm/min., and the etching rate of PR was 17.5 nm/min. Therefore the selection ratio of PR to $SiO_2$ ($SiO_2$/PR) was 3.94, and the selection ratio of 4.0 or greater that is generally required was not obtained.

Comparative Example 3

A storage test sample was prepared under the same condition as that of Example 1, except that HFO-1234ze (E) containing 288 volume ppm of $CF_4$, instead of R22, was used. In addition, the content of moisture contained in HFO-1234ze (E) filled in the pressure-resistant container was 17 volume ppm. As a result of this, a mass change of the test piece before and after the test was less than 0.02%, and coloring that seems like rust was observed on the surface thereof. Moreover, in the same manner as in Example 1, an etching test was also carried out, using HFO-1234ze (E) before addition of oxygen. As a result of this, the etching rate of $SiO_2$ was 75.1 nm/min., and the etching rate of PR was 18.2 nm/min. Therefore the selection ratio of PR to $SiO_2$ ($SiO_2$/PR) was 4.13.

Comparative Example 4

A storage test sample was prepared under the same condition as that of Example 1, except that $CH_4$ was used instead of R22, and the content of $CH_4$ was set to be 9030 volume ppm. In addition, the content of moisture contained in HFO-1234ze (E) filled in the pressure-resistant container was 35 volume ppm. As a result of this, a mass change of the test piece before and after the test was less than 0.01%, and a change in appearance of the test piece was also not observed. In addition, in the same manner as in Example 1, an etching test was also carried out, using HFO-1234ze (E) before addition of oxygen. As a result of this, the etching rate of $SiO_2$ was 60.1 nm/min. On the other hand, the etching of PR did not proceed, and a deposition was observed on a film, and the selection ratio of PR to $SiO_2$ ($SiO_2$/PR) was therefore infinite in theory. However, if a deposition occurs on the film, trenches and holes needed to be etched are covered with a deposition film and then are closed. Therefore, such a condition is not practically adopted.

Comparative Example 5

A storage test sample was prepared under the same condition as that of Example 1, except that $CH_4$ was used instead of R22, and the content of $CH_4$ was set to be 14 volume ppm. In addition, the content of moisture contained in HFO-1234ze (E) filled in the pressure-resistant container was 16 volume ppm. As a result of this, a mass change of the test piece before and after the test was 0.03%, and coloring that seems like rust was slightly observed on the surface thereof. Moreover, in the same manner as in Example 1, an etching test was also carried out, using HFO-1234ze (E) before addition of oxygen. As a result of this, the etching rate of $SiO_2$ was 74.7 nm/min., and the etching rate of PR was 15.1 nm/min. Therefore the selection ratio of PR to $SiO_2$ ($SiO_2$/PR) was 4.95.

Comparative Example 6

A storage test sample was prepared under the same condition as that of Example 1, except that HFO-1234ze (E) in which the content of R22 was less than 1 volume ppm was used and oxygen in an amount of 500 volume ppm in gas phase components was added. In addition, the content of moisture contained in HFO-1234ze (E) filled in the pressure-resistant container was 19 volume ppm. As a result of this, it was observed that a mass change of the test piece before and after the test was 0.02%, and coloring that seems like rust was observed on the surface thereof.

Reference Example 1

In Reference Example 1, HFO-1234ze (E) of which a moisture value was lowered to less than 1 ppm by performing sufficient dehydration was used. In addition, R22 was not mixed to HFO-1234ze (E), and it was confirmed that the content of R22 was less than 1 ppm. Except that, a storage test sample was prepared under the same condition as that of Example 1. Moreover, in the same manner as in Example 1, an etching test was also carried out, using HFO-1234ze (E) before addition of oxygen. As a result of this, a mass change of the test piece before and after the test was less than 0.01%, and a change in appearance of the test piece was also not observed.

Reference Example 2

As the sample 28, by using one in which 5 μm of a $SiO_2$ film was formed on a single crystal silicon wafer and a resist in which opening portions each having 0.3 μm in line width were provided was applied onto the film, etching was carried out under the same condition as that of Example 1. After the etching, the cross section of the silicon wafer was observed with SEM, and, as a result, shape abnormality such as bowing was hardly observed. In addition, it was confirmed that excellent etching characteristics having an aspect ratio of 10 or greater could be obtained.

Reference Example 3

As the sample 28, by using one in which 5 μm of a $SiO_2$ film was formed on a single crystal silicon wafer and a resist in which opening portions each having 0.3 μm in line width were provided was applied onto the film, etching was carried out under the same condition as that of Example 5. After the etching, the cross section of the silicon wafer was observed with SEM, and, as a result, shape abnormality such as bowing was hardly observed. In addition, it was confirmed that excellent etching characteristics having an aspect ratio of 10 or greater could be obtained.

Reference Example 4

As the sample 28, by using one in which 5 μm of a $SiO_2$ film was formed on a single crystal silicon wafer and a resist in which opening portions each having 0.3 μm in line width were provided was applied onto the film, etching was carried out under the same condition as that of Reference Example 2. After the etching, the cross section of the silicon wafer was observed with SEM, and, as a result, the etching proceeded halfway. However, a resist part on the surface was burnt by the etching, and the surface of the $SiO_2$ film was etched.

TABLE 1

|  | Component | | Addition amount of oxygen [ppm] | Moisture [ppm] | Corrosion resistant test | | |
|---|---|---|---|---|---|---|---|
|  | Kind | Content [ppm] |  |  | Period of time [day] | Temperature [° C.] | Change in mass [%] |
| Example 1 | R22 | 3 | 4000 | 10 | 60 | 100 | None |
| Example 2 | R22 | 235 | 4000 | 12 | 60 | 100 | None |
| Example 3 | R22 | 986 | 4000 | 15 | 60 | 100 | None |
| Example 4 | R22 | 3098 | 4000 | 11 | 60 | 100 | None |
| Example 5 | R22 | 8029 | 4000 | 13 | 60 | 100 | None |
| Example 6 | R22 | 3 | 500 | 14 | 60 | 100 | None |
| Comparative Example 1 | R22 | <1 | 4000 | 22 | 60 | 100 | 0.03 |
| Comparative Example 2 | R22 | 12521 | 4000 | 19 | 60 | 100 | None |
| Comparative Example 3 | $CF_4$ | 288 | 4000 | 17 | 60 | 100 | 0.02 |
| Comparative Example 4 | $CH_4$ | 9030 | 4000 | 35 | 60 | 100 | None |
| Comparative Example 5 | $CH_4$ | 14 | 4000 | 16 | 60 | 100 | 0.03 |
| Comparative Example 6 | R22 | <1 | 500 | 19 | 60 | 100 | 0.02 |
| Reference Example 1 | — | — | 4000 | <1 | 60 | 100 | None |

TABLE 2

|  | Component | | Etching test | | |
|---|---|---|---|---|---|
|  | Kind | Content [ppm] | $SiO_2$ [nm/min.] | PR | $SiO_2$/PR |
| Example 1 | R22 | 3 | 77.7 | 15.1 | 5.15 |
| Example 2 | R22 | 235 | 79.2 | 15.8 | 5.01 |
| Example 3 | R22 | 986 | 78.5 | 15.6 | 5.03 |
| Example 4 | R22 | 3098 | 76.1 | 17.2 | 4.42 |

TABLE 2-continued

|  | Component | | Etching test | | |
|---|---|---|---|---|---|
|  | Kind | Content [ppm] | SiO$_2$ [nm/min.] | PR | SiO$_2$/PR |
| Example 5 | R22 | 8029 | 76.8 | 17.4 | 4.41 |
| Comparative Example 1 | R22 | <1 | 77.3 | 14.9 | 5.19 |
| Comparative Example 2 | R22 | 12521 | 68.9 | 17.5 | 3.94 |
| Comparative Example 3 | CF$_4$ | 288 | 75.1 | 18.2 | 4.13 |
| Comparative Example 4 | CH$_4$ | 9030 | 60.1 | 0 | depo |
| Comparative Example 5 | CH$_4$ | 14 | 74.7 | 15.1 | 4.95 |

The above results are shown in Tables. In each of Comparative Example 1 and Comparative Example 6, although the etching characteristics were excellent, corrosion occurred to the test piece. This can be considered that acid generated from HFO-1234ze (E) decomposed by a radical generated from oxygen reacted with moisture existing in the system, and then iron corroded.

On the other hand, as shown in the result of each of Examples 1 to 6, when HFO-1234ze (E) containing R22 was used, the corrosion did not occur. Although there are many unclear points about the process of suppression of the corrosion, it can be considered that R22 suppressed the decomposition of HFO-1234ze (E) due to the oxygen radical, or activation of the acid due to the moisture. In particular, in each of Examples 1 to 5, although the content of oxygen is 3000 volume ppm or greater, and it is considered that polymerization reaction and the like proceed with this content thereof in the patent document 4, by containing 3 volume ppm or greater of R22, the corrosion of the test piece did not occur.

However, the etching rate to PR was changed in accordance with the content of R22 in HFO-1234ze (E). In each of Examples, the selection ratio to SiO$_2$ (SiO$_2$/PR) was sufficient. In particular, in each of Examples 1 to 3 in which the content of R22 was 1000 volume ppm or less, the SiO$_2$/PR-etching selection ratio exceeded five, and etching characteristics were excellent. As shown in each of Reference Examples 2 and 3, also in hole pattern etching, closing of pores did not occur. Therefore, it can be said that excellent etching characteristics were obtained, in case where HFO-1234ze (E) in which 3 volume ppm or greater to 10000 volume ppm or less of R22 was contained was used.

On the other hand, as shown in each of Comparative Example 2 and Reference Example 4, when the content of R22 exceeded 10000 volume ppm, the SiO$_2$/PR-etching selection ratio was lowered. In pattern etching, the resist part was burnt by etching gas, and the surface of the SiO$_2$ film was etched, and it resulted in deterioration of a function as the etching gas.

HFO-1234ze (E) is a compound with high polymerizability when decomposed in a plasma state, because it has an unsaturated bond in its molecule in its structure. Therefore it can be considered that a deposition film that becomes a protection film is formed on the PR that is an organic film, thereby contributing the increase of the selectivity. On the other hand, R22 does not have such an unsaturated bond, and polymerizability is poor. In addition, in a system in which a large amount of R22 is contained, it can be considered that in addition to the low of protection film formability of R22 itself, when activated by plasma, chlorine attacked the unsaturated bond, and the polymerizability deteriorated, and consequently, it led to the lowering of the selectivity.

On the other hand, in each of Comparative Examples 3 to 5, an influence caused by an additive other than R22 was investigated. As a result of this, as shown in Comparative Example 3, an effect of reducing the corrosion of the test piece was not observed when CF$_4$ was contained, as was seen an effect by R22. As shown in Comparative Example 4, when a large amount of CH$_4$ was contained, the corrosion of the test piece was not observed, probably because the decomposition of HFO-12343ze was suppressed. However, the influence on the etching characteristics was large, and it was not preferable as an additive. On the other hand, as shown in Comparative Example 5, in case where a small amount of CH$_4$ was contained, an effect of suppression of the corrosion of the test piece was not observed, differently from case where R22 was contained.

In addition, in Reference Example 1, the relation of the corrosion between moisture, oxygen and HFO-1234ze (E) and the test piece was confirmed. By this result, it was confirmed that if a moisture value was low, HFO-1234ze (E) and O2 did not directly corrode the test piece.

In each of Reference Example 2 and Reference Example 3, an excellent etching shape was obtained, and it was found that HFO-1234ze (E) containing 3 volume ppm or greater to less than 10000 volume ppm of R22 acted as an excellent etching agent practically. On the other hand, in Reference Example 4, HFO-1234ze (E) containing 10000 volume ppm or greater of R22 did not act as an excellent etching agent, because a resist part was burnt by etching.

INDUSTRIAL APPLICABILITY

The present invention can be used for a selective etching process of SiO$_2$, in a process for manufacturing a semiconductor.

EXPLANATION OF SIGNS

10: Storage test container
11: Test piece
12: Valve
13: Lid
14: Pressure-resistant container
20: Reactor
21: Chamber
22: Pressure gauge
23: High frequency power source
24: Lower electrode
25: Upper electrode
26: Gas introduction port
27: Gas discharge line
28: Sample

The invention claimed is:
1. A dry etching agent composition, comprising:
1,3,3,3-tetrafluoropropene; and
a hydrochlorofluorocarbon represented by CH$_x$Cl$_y$F$_z$ (wherein x, y and z are integers of 1 or greater and x+y+z=4),
wherein a concentration of the hydrochlorofluorocarbon relative to 1,3,3,3-tetrafluoropropene is 3 volume ppm or greater to less than 10000 volume ppm, and
wherein the hydrochlorofluorocarbon is chlorodifluoromethane.
2. The dry etching agent composition according to claim 1, wherein a concentration of the hydrochlorofluorocarbon in the dry etching agent composition is 3 volume ppm or greater to less than 1000 volume ppm.

3. A storage container comprising a dry etching agent composition of claim 1.

4. The storage container according to claim 3, wherein, relative to 1,3,3,3-tetrafluoropropene, 10 volume ppm or greater to 10000 volume ppm or less of oxygen is contained, and 1 volume ppm or greater to 10000 volume ppm or less of water is contained in the storage container.

5. A dry etching method, comprising the steps of:
converting a dry etching agent composition according to claim 1 to plasma; and
etching silicon oxide or silicon nitride by using plasma gas converted into plasma.

6. The dry etching method according to claim 5, wherein the concentration of the hydrochlorofluorocarbon in the dry etching agent is 3 volume ppm or greater to less than 1000 volume ppm.

7. The dry etching method according to claim 5, wherein, relative to 1,3,3,3-tetrafluoropropene, 10 volume ppm or greater to 10000 volume ppm or less of oxygen is contained and 1 volume ppm or greater to 10000 volume ppm or less of water is contained in the dry etching agent.

8. The dry etching method according to claim 5, wherein the etching agent contains an additive gas, and
wherein the additive gas is at least one gas selected from the group consisting of $O_2$, $O_3$, CO, $CO_2$, $COCl_2$, $COF_2$, $CF_2(OF)_2$, $CF_3OF$, $NO_2$, NO, $F_2$, $NF_3$, $Cl_2$, $Br_2$, $I_2$ and $XF_n$ (wherein, in a formula, X represents Cl, Br, or I, n is an integer, and $1 \leq n \leq 7$).

9. The dry etching method according to claim 5, wherein the dry etching agent further contains an inert gas, and
wherein the inert gas is at least one gas selected from the group consisting of $N_2$, He, Ar, Ne, Kr and Xe.

* * * * *